United States Patent
Hein

(10) Patent No.: US 7,170,748 B2
(45) Date of Patent: Jan. 30, 2007

(54) HEAT SINK ASSEMBLY FOR INTEGRATED CIRCUITS HAVING A SLIDABLE CONTACT CAPABILITY WITH A MOUNTING MEMBER PORTION OF AN ELECTRONIC EQUIPMENT CHASSIS

(75) Inventor: Gerald K. Hein, Pullman, WA (US)

(73) Assignee: Schweltzer Engineering Laboratories, Inc., Pullman, WA (US)

( * ) Notice: Subject to any disclaimer, the term of this patent is extended or adjusted under 35 U.S.C. 154(b) by 252 days.

(21) Appl. No.: 10/626,993

(22) Filed: Jul. 24, 2003

(65) Prior Publication Data

US 2005/0018404 A1 Jan. 27, 2005

(51) Int. Cl.
*H05K 7/20* (2006.01)

(52) U.S. Cl. .................................... 361/718
(58) Field of Classification Search ............... 361/719, 361/709, 707, 704, 718; 174/16.1; 257/718, 257/719
See application file for complete search history.

(56) References Cited

U.S. PATENT DOCUMENTS

| | | | | |
|---|---|---|---|---|
| 4,546,408 A | * | 10/1985 | Rodseth et al. | 361/720 |
| 5,339,215 A | * | 8/1994 | Nishiguchi | 361/704 |
| 6,140,591 A | * | 10/2000 | Osborne et al. | 174/138 E |
| 6,331,937 B1 | * | 12/2001 | Bartyzel | 361/687 |
| 6,501,658 B2 | * | 12/2002 | Pearson et al. | 361/709 |

* cited by examiner

*Primary Examiner*—Dean A. Reichard
*Assistant Examiner*—Ivan Carpio
(74) *Attorney, Agent, or Firm*—Cook Alex McFarron Manzo Cummings & Mebler, Ltd.

(57) ABSTRACT

The heat sink assembly includes a heat sink member with a body portion and an upper mounting portion. The heat sink member is connected to an integrated circuit on a printed circuit board assembly. A resilient mounting assembly is positioned on the mounting portion of the heat sink assembly and is constructed and arranged to permit the heat sink assembly to be removably mounted on the mounting member, which in turn is attachable to or part of the chassis of the electronic equipment. The mounting assembly includes a bias element, such as a spring, for holding the heat sink assembly and the mounting member together in a low thermal resistance relationship.

20 Claims, 2 Drawing Sheets

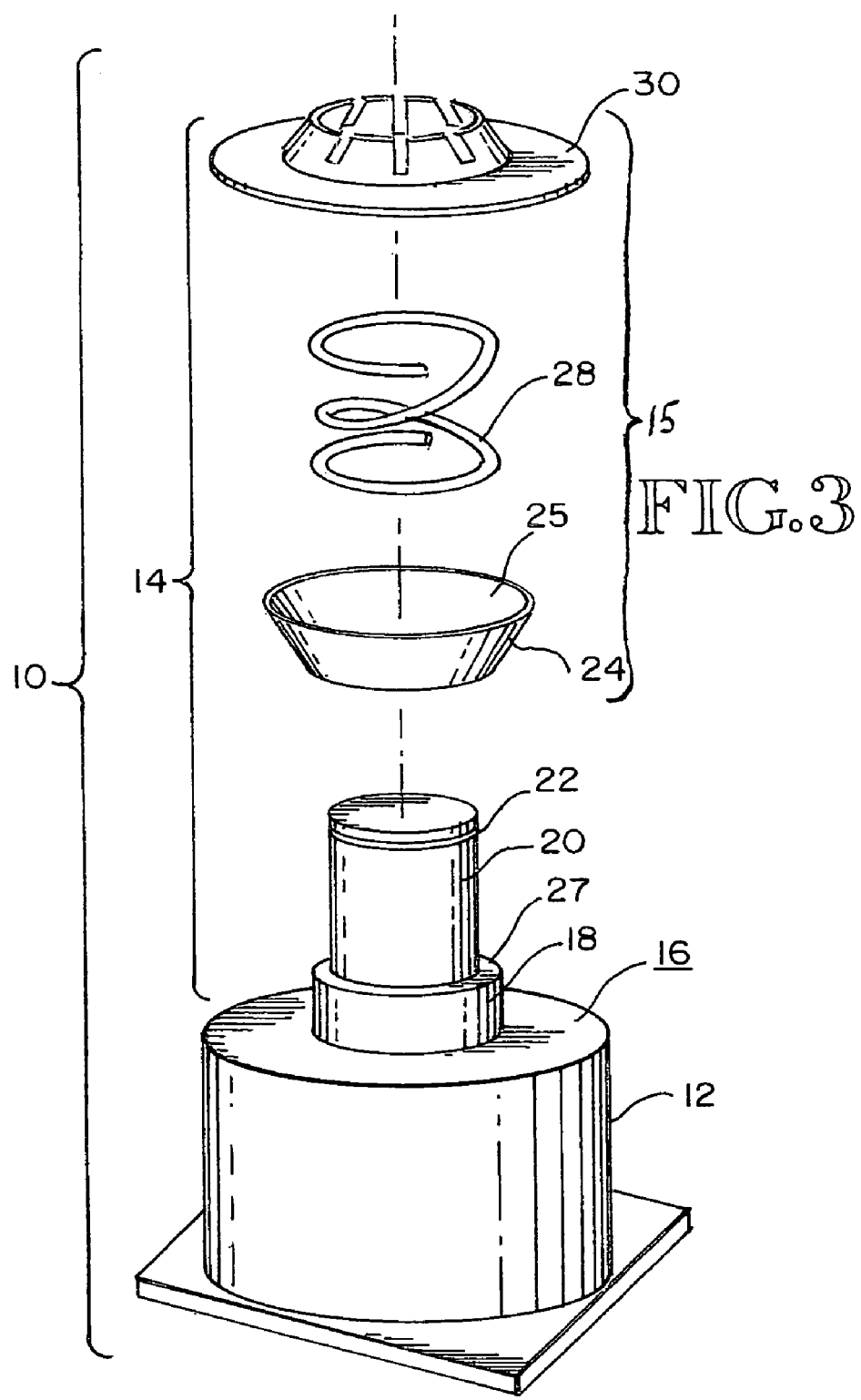

HEAT SINK ASSEMBLY FOR INTEGRATED CIRCUITS HAVING A SLIDABLE CONTACT CAPABILITY WITH A MOUNTING MEMBER PORTION OF AN ELECTRONIC EQUIPMENT CHASSIS

TECHNICAL FIELD

This invention relates generally to heat sink devices for removing heat from semiconductor integrated circuits which are part of an electronic equipment apparatus, and more specifically concerns such a device which is constructed to be removably securable to a mounting member portion of the electronic equipment.

BACKGROUND OF THE INVENTION

It is well known that semiconductor integrated circuits (ICs) consume power, ranging from less than a few microwatts to more than several watts, and that they produce heat. The heat is dissipated in the various semiconductor junctions present in the integrated circuit unless it is removed in some way. If a semiconductor junction is heated beyond the limits established by the integrated circuit manufacturer, the integrated circuit may cease to function properly, may act erratically, or in some cases may be permanently damaged.

Hence, it is important that heat generated by an integrated circuit (IC) be dissipated quickly and reliably. This may be accomplished by the use of a heat sink device which connects the integrated circuit present on an integrated circuit board assembly to a mounting member which is part of the chassis of the electronic equipment, such -that heat moves from the integrated circuit to the chassis and from there to the surrounding air, instead of heating the semiconductor junction.

Typically, such a heat sink is attached to the equipment chassis by hardware elements, such as brackets, screws or other such elements, in order to create a good, thermally conducting interface between the heat sink and the equipment chassis. However, in such arrangements, when the circuit board assembly must removed from the equipment, such as for repair or replacement, the thermally conducting interface (produced by the attachment mechanism) between the heat sink and the chassis must be broken (interrupted). Removal of the printed circuit board requires that the attachment hardware be removed. Often this is difficult, if not impossible, however, due to the inaccessibility of the particular attachment hardware in the equipment. The attachment hardware is often located in the midst of other circuit boards and elements in the equipment, such that the proper tools for removal of the hardware cannot be brought into operative contact with the hardware. Even when tools are not required, it is often difficult for the operator to access the hardware elements for removal.

Hence, it would be desirable to have a heat sink assembly for integrated circuits on integrated circuit boards which is capable of providing a good, thermally conducting interface between the heat sink and the equipment chassis while also permitting convenient removal and insertion of the integrated circuit board into and out of the equipment chassis.

SUMMARY OF THE INVENTION

Accordingly, the present invention is a heat sink assembly for removing heat from a semiconductor integrated circuit used in an electronic equipment apparatus, comprising: a heat sink member having a body portion and a mounting portion and attachable to the semiconductor integrated circuit; and a resilient mounting assembly positioned on the mounting portion of the heat sink member and arranged to permit the heat sink to be removably mounted on a mounting member which in turn is attachable to or part of a chassis portion of the electronic equipment apparatus, wherein the mounting portion includes an element for holding the heat sink member to the mounting member when the heat sink assembly is operatively positioned on the mounting member.

BRIEF DESCRIPTION OF THE DRAWING

FIG. 3 is an exploded view of the heat sink assembly of the present invention.

BEST MODE FOR CARRYING OUT THE INVENTION

The present invention is a heat sink assembly which provides a good thermally conducting interface between a heat sink connected to an integrated circuit and a mounting member engageable by the heat sink, the mounting member being attached to or part of an electronic equipment apparatus. The heat sink assembly is constructed and arranged so that the interface connection between the heat sink assembly and the mounting member can be readily broken and then reestablished with a continuing good, thermally conductive interface.

Figure 1:
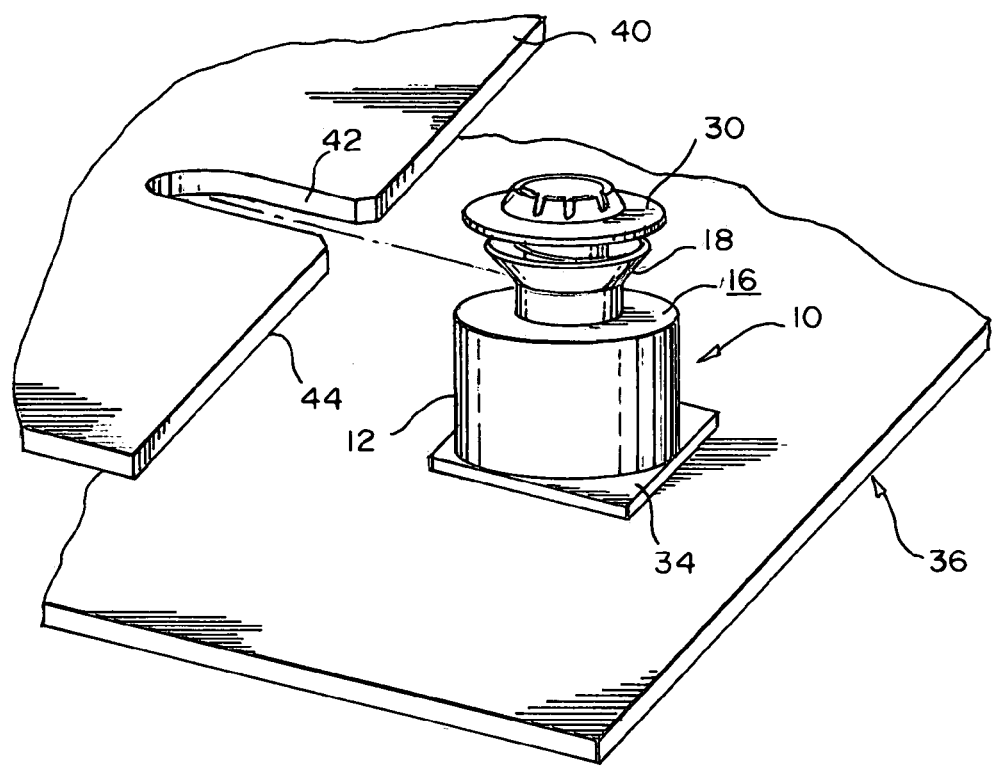
FIG. 1 is a perspective view of the heat sink assembly of the present invention shown in association with a chassis mounting member.
Figure 2:
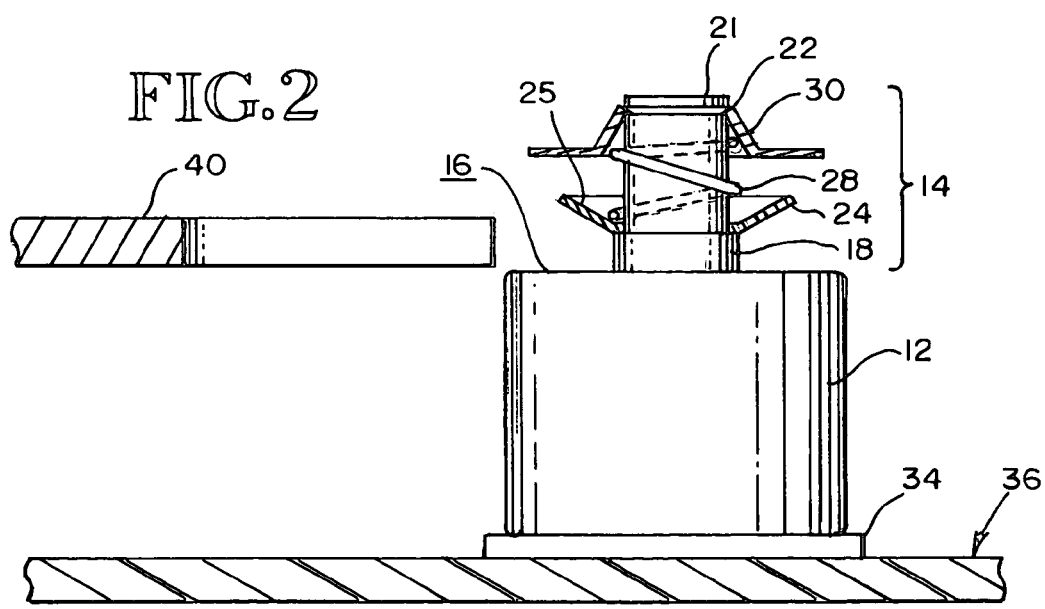
FIG. 2 is a side elevational view of the heat sink assembly of the present invention.

FIGS. 1–3 show the heat sink assembly of the present invention, generally at 10. Heat sink assembly 10 includes a body portion 12 and a mounting portion 14 which extends from one surface 16 of the body portion. As one example, body portion 12 is cylindrical, approximately 0.9 mm high and 1.11 mm in diameter. The body portion can be made from aluminum, or other heat-conducting material. This size and configuration of a heat sink body portion is appropriate for removing heat from integrated circuits. However, it should be understood that this configuration is only one example and that other configurations, with different dimensions, can be used.

As indicated above, mounting portion 14, which extends from top surface 16 of the body portion and is approximately centered thereon, includes a base member 18 which in the embodiment shown in 0.42 mm in diameter and 1.65 mm high. Extending from base member 18 is an upper member 20 which, in the embodiment shown, is cylindrical, approximately 0.32 mm in diameter and approximately 0.39 mm high. Near the top 21 of upper member 20 is a peripheral groove 22. Mounting portion 14 is also made of aluminum in the embodiment shown. Other heat-conducting materials can, however, be used.

A cone-shaped washer 24 is positioned on, i.e. rests against, an upper surface 27 of base member 18. Washer 24 angles upwardly away from base member 18, as shown most clearly in FIG. 2. In the embodiment shown, washer 24 has a central opening which permits it to be fitted over upper member 20; washer 24 has an outside diameter of approximately 0.66 mm. Positioned against upper surface 25 of washer 24, about upper member 20, is a spring element 28. Positioned above spring element 28 in groove 22 is a retainer element 30 which is circular and has approximately the same outside diameter as washer 24. Retainer 30 is held in groove 22 because it has a sliced center cutout region, which permits the retainer to be pressed over a top portion of upper member 20 and then to snap or spring into place when it reaches groove 22. Alternatives to retainer 30, which is convenient and inexpensive, include other retaining mechanisms, such as a nut which is screwed onto the top portion of upper member 20.

Heat sink assembly 10 operatively is positioned on an integrated circuit shown at 34 in FIGS. 1 and 2. Integrated circuit 34 is mounted in turn on a conventional integrated circuit printed circuit board assembly 36. Body portion 12 of the heat sink assembly can be secured to the integrated circuit 34 by various attachment means, including double-sided thermally conductive tape, thermally conductive glue (adhesive) or various mechanical arrangements, including clips or other fasteners. In the present embodiment, thermally conductive adhesive is used to secure the heat sink to the integrated circuit.

Heat sink assembly 10 mates with a mounting surface or member 40 by means of its mounting portion 14. Mounting member 40 is a separate plate which is fitted to the electronic equipment chassis or it is a portion of the electronic equipment chassis itself. If not a portion of the equipment chassis, such as a wall, the mounting member 40 is fixedly secured to the equipment chassis, such as by welding, clamps, threaded fasteners or by an interference fit in a slot in the chassis. In the embodiment shown, an interference fit is used.

Mounting member 40 is made from a thermally conductive material, such as aluminum or similar heat-conducting material. The heat sink assembly 10 is secured to the mounting member 40 by means of open slot 42 in the mounting member which extends inwardly from one edge 44 thereof. In the embodiment shown, slot 42 is slightly wider than the diameter of base member 18 of the mounting portion 14 of the heat sink assembly, with slot 42 being beveled (angled) at an entrance portion to facilitate convenient insertion of the heat sink assembly 10 into a mating relationship with mounting member 40.

To mate the heat sink assembly to the mounting member, the printed circuit board 36 with the heat sink assembly 10 secured to IC 34 is moved in such a manner that base member 18 of the mounting portion of the heat sink assembly fits into slot 42, with the mounting member being firmly held between cone washer 24 and surface 16 of body portion 12 of the heat sink assembly. Cone washer 24, being angled upwardly away from the body portion 12 of the heat sink, provides a "lead-in" capability to assist in the insertion process.

As the heat sink assembly is inserted, the cone washer 24 is forced upwardly against the action-of spring element 28, compressing the spring element. When the heat sink assembly is fully inserted, the compressed spring element 28 provides a bias force against mounting member 40, tending to hold heat sink assembly 10 and mounting member 40 together. The retainer 30, the cone washer 24 and the spring element 28 forms a resilient member assembly 15. An advantage to the use of the spring element arrangement is that it is free to move upwardly a short distance along upper member 20 of the mounting portion so that it can accommodate variable mounting member thicknesses.

A low thermal resistance is created by the arrangement shown between an integrated circuit on a printed circuit card and the chassis in which a mounting member is inserted, with the heat sink assembly of the present invention thermally connecting the integrated circuit and the mounting member. Heat is readily and efficiently conducted from the integrated circuit to the heat sink assembly to the mounting member, from which it is dissipated in the chassis of the equipment and the surrounding air. The thermal interface between the heat sink assembly and the mounting member can be broken and reestablished without adversely affecting the original low thermal resistance.

The advantages of the present invention include a thermal interface arrangement which can be easily broken and then reestablished, such as when the printed circuit board containing the protected IC is extracted and then reinserted into the equipment. The mounting portion of the heat sink assembly includes a cone washer which provides assistance in the convenient joining of the heat sink assembly to the mounting member, preventing possible stubbing when the heat sink assembly is jointed to the mounting member. Low thermal resistance for the arrangement shown is maintained for cooling of the integrated circuit because of continued direct physical contact between the integrated circuit and the chassis through the heat sink assembly.

In the present arrangement, the heat sink assembly slides into operative springed contact with the mounting member, allowing for varying surface thicknesses of the mounting member, and requiring no screws or brackets to secure the heat sink assembly in place on the mounting member.

Although a preferred embodiment of the invention has been described for purposes of illustration, it should be understood that various changes, modification and substitutions may be incorporated in the embodiment without departing from the spirit of the invention which is defined in the claims which follow.

What is claimed:

1. A heat sink comprising:
   a body portion adapted to thermally couple to a semiconductor integrated circuit;
   a mounting portion disposed on the body portion, the mounting portion adapted to removably couple with an open slot formed in an edge of a mounting member, the mounting member attachable to or part of the chassis of an electronic equipment apparatus;
   a resilient mounting assembly removably disposed on the mounting portion; and
   a retaining mechanism to hold the mounting member in place, the retaining mechanism removably coupled to the mounting portion.

2. The heat sink of claim 1, wherein the mounting portion comprises a base member and an upper member, the base member having a greater cross-sectional surface area than the upper member, and the upper member adapted to couple with the open slot formed in the mounting member.

3. The heat sink of claim 2, wherein the resilient mounting assembly comprises a washer removably mounted on the upper member, the washer further adapted to mount above the mounting member when the mounting member is coupled to the heat sink.

4. The heat sink of claim 3, wherein the resilient mounting assembly is further comprised of a spring positioned between the washer and the retaining mechanism, so that the spring forces the washer downwards onto the mounting member when the mounting member is coupled to the heat sink.

5. The heat sink of claim 1, wherein the retaining mechanism comprises a groove formed in the upper member, and a retainer removably mounted on the upper member and adapted to couple with the groove to form a persistent connection with the upper member.

6. A heat sink assembly comprising:
a body portion coupled to a semiconductor integrated circuit through a thermally conducting interface;
a mounting portion extending from a surface of said body portion, said mounting portion removably coupled to an open slot in an edge of a mounting member wherein said mounting member is attachable to or part of a chassis of an electronic equipment apparatus; and
a resilient mounting assembly removably disposed on said mounting portion to form a retaining mechanism to hold the mounting member in place.

7. The heat sink assembly of claim 6, wherein the thermally conducting interface is a thermally conductive adhesive.

8. The heat sink assembly of claim 6, wherein the thermally conducting interface is a double sided thermally conductive adhesive tape.

9. The heat sink assembly of claim 6, wherein the thermally conducting interface attaches the body portion to the semiconductor integrated circuit free from any hardware.

10. The heat sink assembly of claim 9, wherein the semiconductor integrated circuit is mounted on a printed circuit board assembly, said printed circuit board assembly is adapted to removably couple and decouple from said mounting member.

11. The heat sink assembly of claim 10, wherein the printed circuit board assembly can be inserted or removed from the electronic equipment chassis without the removal of the heat sink.

12. The heat sink assembly of claim 6, wherein the mounting portion comprises a base member and an upper member with the base member having a greater cross-sectional surface area than the upper member.

13. The heat sink assembly of claim 12, wherein the resilient mounting assembly comprises a washer, a retainer and a spring, said spring being disposed between the washer and the retainer.

14. The heat sink assembly of claim 13, wherein the resilient mounting assembly provides a bias force by the spring to the washer against the mounting member when compressed.

15. The heat sink assembly of claim 13, wherein the mounting portion further comprises a groove formed in the upper member so that the retainer of the resilient mounting assembly is removably coupled to the groove forming a retaining mechanism to hold the mounting member in place.

16. The heat sink assembly of claim 14, wherein the spring when compressed allows the washer to move upward freely to accommodate variable mounting member thicknesses.

17. A method to heat sink a semiconductor integrated circuit on a printed circuit board assembly to an electronic equipment chassis by sliding contact, comprising the steps of:
coupling a heat sink assembly thermally to a semiconductor integrated circuit on a printed circuit board assembly, wherein the heat sink assembly has an extended body with a mounting portion;
attaching a thermally conductive mounting member to an electronic equipment chassis wherein the mounting member has a slot opening extending inwardly from an edge of the mounting member;
mating the heat sink assembly to the mounting member by sliding the mounting portion to the slot opening; and
conducting the heat generated by the semiconductor integrated circuit to the electronic equipment chassis through contacting the heat sink assembly to the mounting member.

18. The method of claim 17, wherein the printed circuit board assembly can be inserted or removed from the electronic equipment chassis without the removal of the heat sink assembly.

19. A heat sink comprising:
a body portion adapted to thermally couple to a semiconductor integrated circuit;
a mounting portion disposed on the body portion, the mounting portion adapted to removably couple with an open slot formed in a mounting member, the mounting portion comprising a base member and an upper member, the base member having a greater cross-sectional area than the upper member, and the upper member adapted to couple with the open slot formed in the mounting member, the mounting member attachable to or part of the chassis of an electronic equipment apparatus;
a resilient mounting assembly removably disposed on the mounting portion, the resilient mounting assembly comprising an upwardly angled cone shaped washer removably mounted on the upper member, said washer further adapted to mount above the mounting member when the mounting member is coupled to the heat sink; and
a retaining mechanism to hold the mounting member in place, the retaining mechanism removably coupled to the mounting portion.

20. A heat sink assembly comprising:
a body portion coupled to a semiconductor integrated circuit through a thermally conducting interface;
a mounting portion extending from a surface of said body portion, said mounting portion removably coupled to an open slot of a mounting member, wherein said mounting member is attachable to or part of a chassis of an electronic equipment apparatus, the mounting portion further comprising a base member and an upper member, the base member having a greater cross-sectional area than the upper member; and
a resilient mounting assembly removably disposed on said mounting portion to form a retaining mechanism to hold the mounting member in place, the resilient mounting assembly comprising an upwardly angled cone shaped washer, a retainer and a spring, the spring being disposed between the washer and the retainer.

* * * * *

UNITED STATES PATENT AND TRADEMARK OFFICE
CERTIFICATE OF CORRECTION

PATENT NO.        : 7,170,748 B2  
APPLICATION NO. : 10/626993  
DATED             : January 30, 2007  
INVENTOR(S)       : Hein It is certified that error appears in the above-identified patent and that said Letters Patent is hereby corrected as shown below:

On the Title Page: Item (73) Assignee should read --Schweitzer Engineering Laboratories, Inc.--.

Signed and Sealed this

Third Day of April, 2007

JON W. DUDAS  
*Director of the United States Patent and Trademark Office*